(12) United States Patent
Ogashiwa et al.

(10) Patent No.: US 8,558,433 B2
(45) Date of Patent: Oct. 15, 2013

(54) METAL PASTE FOR SEALING, HERMETIC SEALING METHOD FOR PIEZOELECTRIC ELEMENT, AND PIEZOELECTRIC DEVICE

(75) Inventors: Toshinori Ogashiwa, Hiratsuka (JP); Masayuki Miyairi, Hiratsuka (JP); Yoji Nagano, Hino (JP)

(73) Assignees: Tanaka Kikinzoku Kogyo K.K., Tokyo (JP); Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/453,580

(22) Filed: Apr. 23, 2012

(65) Prior Publication Data

US 2012/0212106 A1    Aug. 23, 2012

Related U.S. Application Data

(62) Division of application No. 12/373,311, filed on Jan. 12, 2009.

(30) Foreign Application Priority Data

Mar. 22, 2007   (JP) .............................. P2007-073868

(51) Int. Cl.
*H01L 41/053* (2006.01)
(52) U.S. Cl.
USPC ....................................................... 310/344
(58) Field of Classification Search
USPC ....................................................... 310/344
See application file for complete search history.

(56) References Cited

U.S. PATENT DOCUMENTS

| 4,769,272 A | 9/1988 | Byrne et al. ................... 428/209 |
| 6,157,076 A | 12/2000 | Azotea et al. .................. 257/679 |
| 7,423,220 B2 | 9/2008 | Yoneima et al. ............... 174/257 |
| 2005/0139644 A1 | 6/2005 | Brese et al. ................. 228/248.1 |
| 2009/0230172 A1 * | 9/2009 | Ogashiwa et al. .......... 228/110.1 |

FOREIGN PATENT DOCUMENTS

| DE | 3414065 A1 | 12/1985 | |
| JP | 56-69304 A * | 11/1979 | ............... B22F 5/00 |
| JP | 11-354660 | 12/1999 | |
| JP | 2005-216508 | 8/2005 | |
| JP | 2005-317793 | 11/2005 | |
| JP | 2005-347851 | 12/2005 | |
| JP | 2007-043092 | 2/2007 | |

* cited by examiner

*Primary Examiner* — Thomas Dougherty
(74) *Attorney, Agent, or Firm* — Roberts & Roberts, LLP

(57) ABSTRACT

The present invention is a metal paste for sealing comprising a metal powder and an organic solvent characterized in that the metal powder is one or more kinds of metal powders selected from a gold powder, a silver powder, a platinum powder and a palladium powder which has a purity of 99.9% by weight or more and an average particle size of 0.1 μm to 1.0 μm and that the metal powder is contained in a ratio of 85 to 93% by weight and the organic solvent is contained in a ratio of 5 to 15% by weight. As a sealing method using this metal paste, there is a method of applying and drying a metal paste, sintering it at 80 to 300° C. to form a metal powder sintered body and after that pressurizing the base member and the cap member while heating the metal powder sintered body.

4 Claims, 1 Drawing Sheet

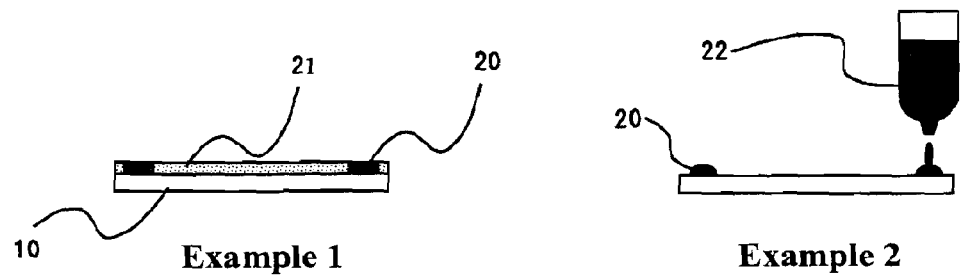
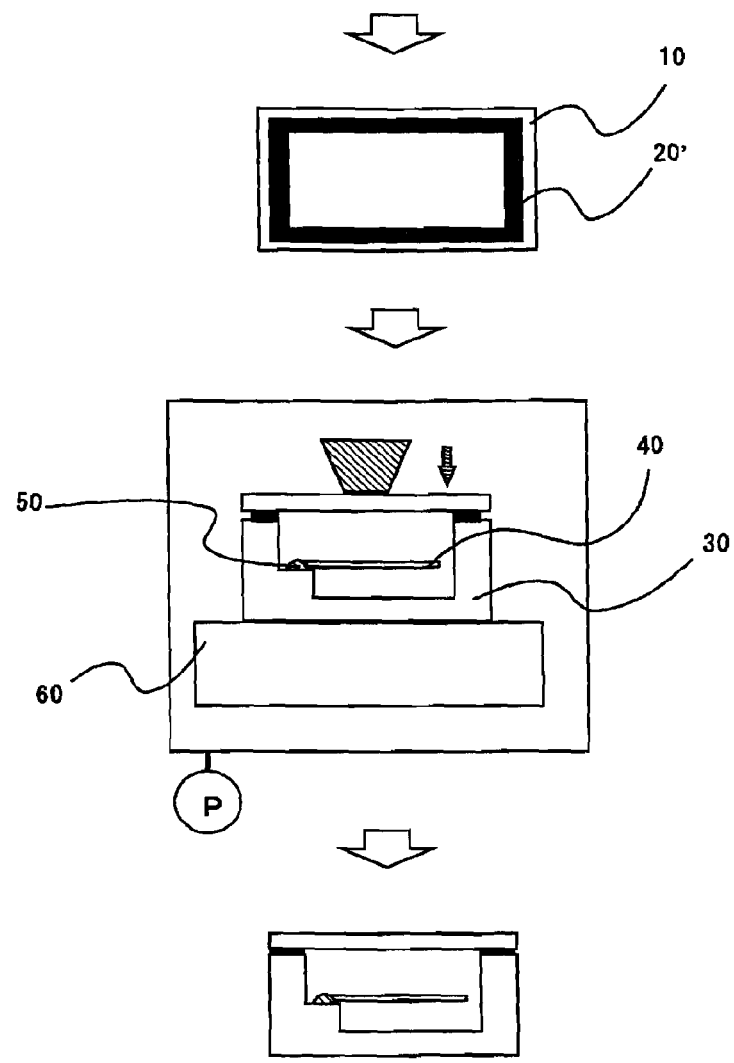

METAL PASTE FOR SEALING, HERMETIC SEALING METHOD FOR PIEZOELECTRIC ELEMENT, AND PIEZOELECTRIC DEVICE

CROSS REFERENCE TO RELATED APPLICATION

This application is a divisional of U.S. patent application Ser. No. 12/373,311 which is incorporated herein by reference.

TECHNICAL FIELD

The present invention relates to a metal paste for use in hermetic sealing of a package comprising a piezoelectric element such as a crystal oscillator, and a sealing method using this metal paste. Specifically, the present invention relates to a method which enables sealing at a lower temperature than conventional brazing methods and excellent in hermeticity.

BACKGROUND ART

A piezoelectric element such as a crystal oscillator used in various electronic equipments such as a mobile telephone is used in a condition encapsulated in a package so as to prevent oxidation and deterioration by moisture and oxygen in the air. As a method of hermetic sealing of this piezoelectric element package, a brazing method is commonly used. Hermetic sealing by the brazing method is performed by fixing a piezoelectric element inside the base member which serves as a package container, stacking a brazing material molded in accordance with the shape of the bonded part and a cap member which serves as a lid, heating and melting the brazing material and thereby bonding the base member and the cover member.

Fluxless brazing materials are used as brazing materials for package sealing so as to prevent contamination to the piezoelectric element, and among such materials, Au—Sn based brazing materials which are excellent in reliability and corrosion resistance are commonly used. And the working temperature at the time of sealing is often set to 300° C. or more in consideration of a melting point of the brazing material (The melting point of an Au—Sn brazing material is around about 280° C.).

Patent Document 1: Japanese Patent Application Laid-Open No. 2005-347851

DISCLOSURE OF THE INVENTION

The hermetically sealed piezoelectric element package is then mounted on a circuit board, and on that occasion, an Sn-based solder is used as a bonding material for bonding mounting electrodes of the piezoelectric element package and pad electrodes of the circuit board. However, since the melting point of an Sn-based solder is 210 to 225° C., the bonding temperature at the time of mounting is often set to 250 to 260° C., which is in the vicinity of the melting point of an Au—Sn based brazing material. On this account, the Au—Sn based brazing material, which is a sealant, may be remelted during the mounting procedure on the circuit board, and the hermeticity of the package may be deteriorated. Particularly when the remelting of the sealant occurs while the inside of the package is maintained in a vacuum state, the sealant is sucked into the package, sticks to the surface of the piezoelectric element and affects the characteristics thereof (change in frequency and vibration behavior in the case of a crystal oscillator).

The present invention has been made under the above background and an object thereof is to provide a sealant and a sealing method which enable to bond the base member and the cap member at a relatively low temperature and secure sufficient hermeticity when hermetically sealing a piezoelectric element package such as a crystal oscillator. In addition, the present invention provides those which enable to maintain the characteristics of the internal piezoelectric element without causing remelting even when subjected to re-heating.

So as to solve the above problems, the present inventors have examined use of a new bonding member which will replace the brazing materials of the prior art. And the present inventors have conducted intensive studies and have found a metal paste having the following constitution.

That is, the present invention is a metal paste for sealing comprising a metal powder and an organic solvent characterized in that the metal powder is one or more kinds of metal powders selected from a gold powder, a silver powder, a platinum powder and a palladium powder which has a purity of 99.9% by weight or more and an average particle size of 0.1 μm to 1.0 μm and that the metal powder is contained in a ratio of 85 to 93% by weight and the organic solvent is contained in a ratio of 5 to 15% by weight.

The reason why the form of a metal paste is adopted as a sealant in the present invention is that the minute metal powder which constitutes the metal paste forms sintered bodies by performing sealing with this in accordance with the method described later and further that they will bond with each other strongly while being plastically deformed, and consequently they form a dense bonded part. And the present invention presents a metal paste suitable for a sealant by definitely prescribing the purity and particle size of a metal powder which constitutes the metal paste as well as the content ratios of the metal powder and the organic solvent.

The metal powder which constitutes the metal paste according to the present invention is one or more kinds of metal powders selected from a gold powder, a silver powder, a platinum powder, and a palladium powder which has a purity of 99.9% by weight or more and an average particle size of 0.1 μm to 1.0 μm. The reason why high purity as much as 99.9% by weight or more is required as a purity of the metal powder is that when the purity is low, hardness of the powder increases, plastic deformation becomes hard to occur and thus dense bonded part cannot be formed. In addition, the reason why constitution metal of the metal powder is limited to either one of gold, silver, platinum or palladium is that they are excellent in corrosion resistance and oxidation resistance.

Further, as for the average particle size of the metal powder, a metal powder having a particle size more than 1.0 μm is hard to develop a preferable bonding state even when the powder is sintered. In the meantime, the reason why the particle size of the metal powder is prescribed as 0.1 μm or more is based on consideration of dispersibility when the powder is made into a paste. That is, when the particle size is too small, aggregation is liable to occur in the paste, and in order to evade this problem, the content ratio of the organic solvent increases to more than the following ratio.

The kind of the organic solvent which is an essential component of the metal paste along with the metal powder is not particularly limited. Preferred are ester alcohols, terpineol, pine oil, butyl carbitol acetate, butyl carbitol and carbitols. For example, 2,2,4-trimethyl-3-hydroxypentaisobutyrate ($C_{12}H_{24}O_3$) are included as a preferable organic solvent of ester alcohol type. This is because these solvents can be dried at a relatively low temperature.

And as for the content ratios of the metal powder and the organic solvent, the metal powder is contained in 85 to 93% by weight whereas the organic solvent is contained in 5 to 15% by weight. The reason why these ratios are prescribed is based on consideration of use as a sealant. In the sealing method using a metal paste according to the present invention, the metal paste after application is heated during drying, sintering and so on. In this process, gas will be generated from the organic solvent in the paste, and when the content ratio of the organic solvent is high, there is a possibility that this gas remains inside the package, and there is also a possibility that the organic solvent remains in the bonded part after the sealing and this may generate gas. In this way, the gas in the package becomes a factor which deteriorates the characteristics of internal elements such as a piezoelectric element. Therefore, it is preferable as a metal paste for sealing that the content of the organic solvent is as low as possible in a range capable of dispersing the metal powder. The present invention has secured the dispersibility of the metal powder by prescribing the particle size of the metal powder as above while prescribing the content ratio of the organic solvent without causing such a problem as above as 5 to 15% by weight.

Here, the metal paste according to the present invention may contain an additive in consideration of the used state. It is necessary to apply a metal paste to a base member and the like which are to be sealed in the embodiment of the present invention, and the application method can be selected in accordance with the shape and dimension of the objects to be bonded, and includes ink jet process, photoresist implantation process, screen printing and application with a dispenser. The metal paste according to the present invention basically consists of a blend of a metal powder and an organic solvent, and it can be sufficiently usable even by this basic constitution but may contain the following additives in accordance with the application method above.

It is preferable that 0.01 to 1% by weight of a surfactant is added to the above basic constitution in the application by photoresist implantation. The surfactant suppresses aggregation of the metal powder in the paste and facilitates application. As this surfactant, alkylamines, alkylamine carboxylates, carboxylic acid amides, ester amines, organotitanium compounds (titanium coupling agents), sodium sulfocarboxylates can be used.

Besides, it is preferable that 0.01 to 4% by weight of a resin is added to the above basic constitution in a metal paste used for screen printing and application with a dispenser. This resin is added for the purpose of suppressing aggregation of the metal powder and securing viscosity characteristics when the paste is supplied. Preferable resins are one or more kinds selected from acrylic-based resins, cellulosic resins and alkyd resins. As acrylic-based resins, methyl methacrylate polymers are included, and as cellulosic resins, ethyl cellulose, and as alkyd resins, phthalic anhydride resins are included respectively. Among these, ethyl cellulose is particularly preferable. The addition amount of the resin is prescribed as the above range since the effect does not develop when it is less than 0.01% by weight, while densification of the bonded part after the sealing is inhibited when it is more than 4% by weight.

Further, it is preferable in a metal paste used for screen printing and application with a dispenser that 0.05 to 2% by weight of a thixotropic agent is added in addition to the above resin. The thixotropic agent has an effect of preventing the paste from drooping and regulates applicability by screen-printing or with a dispenser. Examples of the thixotropic agent include sugar alcohols, carboxylic acid amides (stearic acid amide, etc.), polyacid amides.

And further, 0.01 to 1% by weight of a surfactant may be added in the case of a metal paste used for screen printing and application with a dispenser. The metal paste for these application methods already contains a resin for the suppression of aggregation, but it can be made into a more homogeneous paste by adding a surfactant. The metal paste which also contains this surfactant is useful in a dispenser for microscrew discharging which applies the paste while regulating a small discharging volume and in a dispenser for impact discharging which performs a high speed discharging. Here, specific examples of the surfactant are the same as above.

The above-mentioned additives are added in consideration of the application method, and it is preferable that the addition amount is reduced as much as possible, and the addition amount in total is preferably 0.01 to 4% by weight. This is because the additives may remain in the bonded part as a residual substance after the sealing.

Next, the sealing method using the metal paste according to the present invention is described. The sealing method according to the present invention is a hermetic sealing method of a piezoelectric element by bonding a base member accommodating the piezoelectric element and a cap member serving as a lid thereof to achieve hermetic sealing characterized by the method comprising the steps of:
(a) applying a metal paste according to the present invention to a base member or a cap member;
(b) drying the above metal paste and sintering at a temperature of 80 to 300° C. to form a metal powder sintered body; and
(c) disposing the cap member onto the base member with the above metal powder sintered body therebetween, and bonding the base member and the cap member by applying a pressure from one direction or from the both directions while heating at least the metal powder sintered body.

By the sealing method according to the present invention, the applied metal paste is heated in a condition without pressure and thereby made into the metal powder sintered body as a bonding material which corresponds to a brazing material in the conventional art and then the base member and the cap member are bonded and sealed by heating under pressure the cap member and the base member with the metal powder sintered body therebetween. At the time of this bonding, the metal powder constituting the metal powder sintered body is bonded with each other while plastically deformed and forms a dense bonded part. And the bonded part densified in this way is a dense bulk body consisting of gold and the like having a high purity. Therefore, the melting point thereof is close to the melting point of the metal used and accordingly, it does not melt when subjected to reheating and the hermeticity of the package can be maintained. Hereinbelow, the respective steps will be described.

As for the application method of the metal paste, ink jet process, photoresist implantation process, screen printing, application with a dispenser (including microscrew discharging and impact discharging) can be adopted as above.

The reason for drying the applied metal paste is to remove the organic solvent in the paste. This drying is preferably performed at −20° C. or higher and 5° C. or lower. The atmosphere in the drying step may be an atmosphere under reduced pressure. This enables to prevent moisture in the atmosphere from condensing on the surface of the metal powder in the drying process. When the atmosphere is an atmosphere under reduced pressure, the pressure is preferably 100 Pa or less, more preferably 10 Pa or less, but the vacuum degree of this atmosphere is set in accordance with the volatility of the organic solvent in the metal paste.

It is needed in the present invention to sinter the metal paste after drying. This generates a closely approximate state forming point contacts between the metal particles in the paste and between the bonding surface (paste applied surface) of the base member or the cap member and the metal particles, and the metal paste is formed into a metal powder sintered body. This metal powder sintered body causes plastic deformation at the contact area and generates bonding between the metal atoms at the deformed interface when heated and pressurized at the time of bonding as described later and thus causes densification sufficient to secure hermeticity of the package. In this regard, when the paste is pressurized without being sintered, gap between the particles increases without causing bonding between the particles and thus it is not possible to achieve connection.

It is preferable that the temperature of this sintering is 80 to 300° C. This is because the point contacts as mentioned above are not achieved below 80° C. In the meantime, when the sintering is performed at a temperature higher than 300° C., sintering proceeds excessively, and necking between the metal powders proceeds and causes strong bonding, and thus densification cannot be achieved even when the pressure is applied afterwards, and for this reason, the hermeticity of the package is deteriorated. This is also based on a reason that the bonding at 300° C. or lower is preferable from a point of view protecting a piezoelectric element. Here, the heating time for sintering is preferably 30 to 120 minutes. This is because the temperature of the sintering furnace does not become stable and sufficient sintering cannot be achieved in a short time whereas productivity is deteriorated when the heating time is long. Furthermore, it is preferable to perform the sintering in a state without pressure.

The bonding with pressure after the above mentioned sintering is performed by stacking and pressurizing the base member and the cap member. It is preferable that the pressure of the pressurization is more than the surrender strength of the metal powder sintered body so as to densify the bonded part. Here, the pressurization may be performed from either one direction of the base member or the cap member, and may be performed from the both directions.

And it is necessary in this bonding step to apply pressure while heating the metal powder sintered body. The reason is that when the pressure is applied without heating, densification of the bonded part is insufficient, bonding strength is not sufficient, and thereby the hermeticity cannot be secured. It is preferable that the heating temperature of this time is set to 80 to 300° C. This is because bonding is not achieved below 80° C., whereas the influence of heat distortion at the time of cooling increases when 300° C. is exceeded.

In addition, it is preferable to make the working atmosphere under vacuum in the bonding step. This is because a piezoelectric element such as a crystal oscillator shows excellent vibration characteristics (such as crystal impedance) in the vacuum as compared with in normal atmosphere, and therefore it is preferable to draw the inside of the package under vacuum. As for the vacuum degree of the working atmosphere, high vacuum atmosphere of $1 \times 10^{-1}$ Pa or higher is preferable. Bonding is possible even in a vacuum atmosphere in the present invention.

In addition, it is preferable to apply supersonic wave as well as heating in the bonding step. By combining heating with supersonic wave, plastic deformation and binding of the metal powder is promoted and stronger bonded part can be formed. When supersonic wave is applied, the condition thereof is preferably the amplitude of 0.5 to 5 μm and the applying time of 0.5 to 3 seconds. This is because application of excessive supersonic wave gives damages on the piezoelectric element.

It is sufficient from the purpose to perform heating and application of supersonic wave in the bonding step mentioned above at least on the metal powder sintered body but they may be performed over the whole base member or the cap member. As for the heating method, it is preferable to heat a tool for pressurizing the base member or the cap member and utilize the heat transfer at that time. This is because it is a simple method and besides it is preferable in the point that the method does not give influence of the heat to the piezoelectric element. Likewise, it is preferable to oscillate the supersonic wave from the tool for pressurizing the base member or the cap member for applying the supersonic wave.

Materials used for the base member and the cap member to be bonded are not particularly limited in the method according to the present invention, and those usually used for piezoelectric element packages can be used and in particular, for example, alumina ceramics, kovar (Fe—Ni—Co based alloy), 42 alloy (Fe—Ni based alloy), etc. can be used. In addition, those in which these materials are used as base materials and one layer or more layers of gold, palladium, nickel or the like is plated can be also used.

BRIEF DESCRIPTION OF THE DRAWINGS

FIG. 1 schematically illustrates the bonding step in this embodiment.

BEST MODE FOR CARRYING OUT THE INVENTION

First Embodiment:

Hereinbelow, a preferred embodiment of the present invention is described. In this embodiment, hermetic sealing of a crystal oscillator package as a piezoelectric element package was performed. FIG. 1 shows outline of the steps. Hereinbelow, the bonding step in respective examples is described while referring to the drawing.

Example 1

First, a metal paste 20 is applied onto a cap member 10. The cap member 10 is made of kovar, and Ni (1 μm) and Au (1 μm) are plated on the surface thereof. The metal paste used was prepared by mixing a gold powder (average particle size: 0.3 μm) having a purity of 99.99% by weight which was produced with wet reduction process and an ester alcohol (2,2,4-trimethyl-3-hydroxypentaisobutyrate ($C_{12}H_{24}O_3$)) as an organic solvent. The content ratio of the organic solvent was 10% by weight.

As for the application of the metal paste, after forming a pattern which was to be the metal paste area with photoresist 21 beforehand, the metal paste was applied onto the entire surface so as to fill the recessed area (300 μm in width) with the metal paste and unnecessary paste was wiped off.

After the metal paste 20 was applied, this was vacuum dried at −10° C. in a dryer. Then, the cap member was heated at 230° C. for 30 minutes in an electric furnace and the metal paste was sintered to form a powdered metal sintered body 20'.

And a crystal oscillator 40 was fixed on a base member 30 (dimension: 2.5 mm×2.0 mm) made of alumina ceramic with a conductive adhesive 50, and the sintered cap member was placed thereon. The bonding of the cap member was performed by placing the package under a vacuum atmosphere (1×10⁻1 Pa) and applying a pressure (load 167N) from the cap member while keeping it at 230° C. by heat transfer from a heat stage 60. The heating and pressurizing time in this bonding step was set to 10 minutes.

Example 2

In this example, application method of the metal paste was changed and the crystal oscillator package was sealed. The metal paste was supplied and applied on to the same cap member as in Example 1 with a dispenser 22 so that it became the same shape. Then, drying and sintering of the metal paste and the bonding to the base member were performed by the same steps as in Example 1 to seal the package.

Example 3

In this example, supersonic wave was applied simultaneously with pressurization and heating of the sintered body to achieve bonding. After the metal paste was applied, dried and sintered on a cap member in the same manner as in Example 1, the cap member was placed on a base member to which a crystal oscillator was fixed, and bonding was performed by heating and pressurizing in the same manner as in Example 1 and thus hermetic sealing was achieved (the same conditions as in Example 1). The supersonic wave was applied from the tool used at the time of the pressurization and the amplitude was set to 1.0 μm, output was to 3.5 W, and application time was to one second.

Crystal impedance value (hereinbelow referred to as CI value) was measured for the crystal oscillator packages sealed in each of the above-mentioned Examples. The measurement of the CI value was performed by zero phase method using a π circuit with a crystal electric current of 10 μW. This measurement was performed for packages immediately after the sealing and after heat-treated in the atmosphere at 300° C. for 0.5 hours after the sealing. The results are shown in Table 1.

TABLE 1

| | CI value | |
|---|---|---|
| | Immediately after sealing | After heat treatment |
| Example 1 | 25.0 Ω | 25.0 Ω |
| Example 2 | 24.5 Ω | 24.5 Ω |
| Example 3 | 26.0 Ω | 26.0 Ω |
| Reference value | 60 Ωmax | |

It was confirmed from Table 1 that any of the crystal oscillator packages produced through the sealing method of the respective examples satisfied the reference value, and sufficient hermeticity was duly secured. It was also confirmed that these packages showed no changes in the CI value after subjected to heat treatment which conventional sealing with a brazing material failed to endure and thus hermeticity was duly maintained after heat treatment.

Second Embodiment

In this embodiment, a metal paste in which a surfactant, a resin and a thixotropic agent were added to a metal paste (gold paste) was prepared. The production process of the metal paste was basically the same as in the first embodiment (particle size of the metal powder: 0.3 μm) and the composition was adjusted by adjusting the blending amounts of the additives. The composition of the metal paste examined here is as follows.

TABLE 2

| | Au powder | | Organic solvent | | Surfactant | | Resin | | Thixotropic agent | |
|---|---|---|---|---|---|---|---|---|---|---|
| | Particle size | Content | Kind | Content | Kind | Content | Kind | Content | Kind | Content |
| Example 1 | 0.3 μm | 90 | Ester | 10 | — | — | — | — | — | — |
| Example 4 | | 90 | alcohol | 9.8 | Alkyl-amine | 0.2 | — | — | — | — |
| Example 5 | | 90 | | 8 | — | — | Ethyl cellulose | 2 | — | — |
| Example 6 | | 90 | | 7.9 | — | — | Ethyl cellulose | 2 | Sugar alcohol | 0.1 |
| Example 7 | | 90 | | 8 | — | — | Ethyl cellulose | 1 | Sugar alcohol | 1 |
| Example 8 | | 90 | | 8 | — | — | Ethyl cellulose | 1 | Stearic acid amide | 1 |
| Example 9 | | 88 | | 7.8 | Alkyl-amine | 0.2 | Ethyl cellulose | 2 | Sugar alcohol | 2 |
| Comparative Example | 2 μm | 90 | | 9.8 | Alkyl-amine | 0.2 | — | — | — | — |

"—": not added; each content is expressed by wt %.

Then, package sealing was performed using the produced metal paste, the presence or absence of the change in the CI value before and after the heat treatment was examined, and presence or absence and evaluation of defects when forming a ring pattern on the bonded part were also examined. Here, the sealing conditions after the application step were the same as in First Embodiment. In this embodiment, a metal paste using a metal powder having a different particle size (2 μm) was also examined as Comparative Example. The results are shown in Table 3.

TABLE 3

| | Constitution of metal paste | | | Examination result by each application method Upper section: Presence/absence of increase in CI value before and after heat treatment Lower section: Presence/absence (Evaluation) of defects in ring pattern formation | | | | |
|---|---|---|---|---|---|---|---|---|
| | Surfactant | Resin | Thixotropic agent | Photoresist | Screen-printing | Dispenser | Microscrew | Impact |
| Example 1 | — | — | — | ○ | ○ | ○ | ○ | ○ |
| | | | | ○ (A) | Δ (B) | Δ (B) | Δ (B) | Δ (B) |
| Example 4 | Presence | — | — | ○ | ○ | ○ | ○ | ○ |
| | | | | ○ (A) | Δ (B) | Δ (B) | Δ (B) | Δ (B) |
| Example 5 | — | Presence | — | ○ | ○ | ○ | ○ | ○ |
| | | | | Δ (D) | ○ (A) | Δ (C) | Δ (E) | Δ (E) |
| Example 6 | — | Presence | Presence | ○ | ○ | ○ | ○ | ○ |
| | | | | Δ (D) | ○ (A) | ○ (A) | Δ (E) | Δ (E) |
| Example 7 | — | Presence | Presence | ○ | ○ | ○ | ○ | ○ |
| | | | | Δ (D) | ○ (A) | ○ (A) | Δ (E) | Δ (E) |
| Example 8 | — | Presence | Presence | ○ | ○ | ○ | ○ | ○ |
| | | | | ○ (D) | ○ (A) | ○ (A) | Δ (E) | Δ (E) |
| Example 9 | Presence | Presence | Presence | ○ | ○ | ○ | ○ | ○ |
| | | | | Δ (D) | ○ (A) | ○ (A) | ○ (A) | ○ (A) |
| Comparative Example | Presence | — | — | x | x | x | x | x |
| | | | | Δ (E) | x | x | x | x |

Upper section:
○: No increase in CI value before and after heat treatment
x: Increase observed in CI value before and after heat treatment
Lower Section:
○: No defects
Δ: Some defects are present but sealing was possible
x: Not densified and sealing in itself was impossible
Evaluation:
A: Film thickness is uniform and good
B: Film thickness is hard to secure
C: Drooping occurs in the paste
D: Being possible of causing voids
E: Clogged up while forming foils in discharging part in some cases It can be understood from Table 3 that a good pattern can be formed by adjusting the composition of the metal paste. However, addition of all the additives at the same time is not effective for all application methods and thus it can be understood that selection in accordance with the application method is preferable.

In addition, it was confirmed that sealing was hardly possible when the particle size of the metal powder was increased as in Comparative Example. It is considered that this is resulted from failure in appropriate densification when sintered due to excessively large particle size.

Industrial Applicability

As described above, the metal paste and the sealing method according to the present invention enable to bond the base member and the cap member relatively at a low temperature in the sealing of a piezoelectric element package. Owing to this, the piezoelectric element can be protected from thermal stress in the cooling process after the bonding. The method according to the present invention enables to seal the piezoelectric element package effectively, and the hermeticity thereby is sufficient. And according to the present invention, the hermeticity can be maintained even if the package after the sealing is heated again without causing melting of the bonded part. Owing to this, the yield of the electronic equipments using a piezoelectric element can be improved.

The invention claimed is:

1. A piezoelectric device having a constitution in which a base member accommodating a piezoelectric element and a cap member serving as a lid are bonded with a metal powder sintered body and hermetically sealed wherein the metal powder sintered body is formed by sintering a metal paste comprising one or more kinds of metal powders selected from a gold powder, a silver powder, a platinum powder and a palladium powder, any of which has a purity of 99.9% by weight or more and an average particle size of larger than 0.1 μm and 1.0 μm or smaller.

2. The piezoelectric device according to claim 1, wherein the metal powder sintered body is formed by sintering the metal paste at a temperature of 80 to 300° C.

3. The piezoelectric device according to claim 1 wherein the metal paste comprises a metal powder and an organic solvent, and the metal powder is contained in a ratio of 85 to 93% by weight and the organic solvent is contained in a ratio of 5 to 15% by weight.

4. The piezoelectric device according to claim 2 wherein the metal paste comprises a metal powder and an organic solvent, and the metal powder is contained in a ratio of 85 to 93% by weight and the organic solvent is contained in a ratio of 5 to 15% by weight.

* * * * *